United States Patent
Song et al.

(10) Patent No.: US 12,501,568 B2
(45) Date of Patent: Dec. 16, 2025

(54) ELECTRONIC DEVICE INCLUDING PLATE, PLATE, AND METHOD FOR MANUFACTURING PLATE

(71) Applicant: SAMSUNG ELECTRONICS CO., LTD., Suwon-si (KR)

(72) Inventors: Kyunghwan Song, Suwon-si (KR); Goeun Kim, Suwon-si (KR); Inkyu Kim, Suwon-si (KR); Hyunsoo Kim, Suwon-si (KR); Hyesun Park, Suwon-si (KR); Heesung Lee, Suwon-si (KR); Youngjun Heo, Suwon-si (KR); Hyunsuk Choi, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 332 days.

(21) Appl. No.: 17/810,161

(22) Filed: Jun. 30, 2022

(65) Prior Publication Data
US 2023/0007798 A1    Jan. 5, 2023

Related U.S. Application Data

(63) Continuation of application No. PCT/KR2022/008790, filed on Jun. 21, 2022.

(30) Foreign Application Priority Data

Jun. 30, 2021   (KR) ................. 10-2021-0085656

(51) Int. Cl.
*H05K 5/04*     (2006.01)
*C23F 1/20*     (2006.01)
(Continued)

(52) U.S. Cl.
CPC .............. *H05K 5/04* (2013.01); *C23F 1/20* (2013.01); *C23F 1/36* (2013.01); *C25D 11/04* (2013.01); *C25D 11/16* (2013.01); *C25D 11/18* (2013.01)

(58) Field of Classification Search
CPC .......... H05K 5/04; C25D 11/16; C25D 11/18; C25D 11/04; C23F 1/20; C23F 1/36; C23F 1/125; H04M 1/0202; C23G 1/125
(Continued)

(56) References Cited

U.S. PATENT DOCUMENTS

2009/0133782 A1    5/2009    Uchida et al.
2010/0044341 A1    2/2010    Uchida et al.
(Continued)

FOREIGN PATENT DOCUMENTS

CN    106811785 A    6/2017
CN    107937953 A    4/2018
(Continued)

OTHER PUBLICATIONS

International Search Report dated Sep. 30, 2022 in connection with International Patent Application No. PCT/KR2022/008790, 2 pages.
(Continued)

*Primary Examiner* — Tri V Nguyen

(57) ABSTRACT

According to various embodiments of the present disclosure, an electronic device may comprise a housing including a front plate and a rear plate and a display. At least one of the front plate or the rear plate may include a plate exposed to an outside. The plate may include a metal member including a first metal and an oxide layer formed on at least one surface of the metal member. The metal member may comprise a first portion including irregularities formed by at least one second metal included in a first solution, the at least one second metal being substituted for the a portion of the metal
(Continued)

member, the at least one second metal being removed from the metal member by the first solution and a flat second portion etched by the first solution.

18 Claims, 12 Drawing Sheets

(51) Int. Cl.
    *C23F 1/36*     (2006.01)
    *C25D 11/04*     (2006.01)
    *C25D 11/16*     (2006.01)
    *C25D 11/18*     (2006.01)

(58) Field of Classification Search
    USPC ........................................ 428/936; 455/575.1
    See application file for complete search history.

(56) References Cited

U.S. PATENT DOCUMENTS

| | | |
|---|---|---|
| 2011/0056836 A1 | 3/2011 | Tatebe et al. |
| 2011/0315658 A1 | 12/2011 | Shibata et al. |
| 2013/0292256 A1 | 11/2013 | Hu et al. |
| 2017/0347476 A1* | 11/2017 | Hwang ................. C25D 11/12 |
| 2021/0095388 A1 | 4/2021 | Lee et al. |

FOREIGN PATENT DOCUMENTS

| | | |
|---|---|---|
| CN | 110067014 B | 1/2021 |
| EP | 3 124 650 A1 | 2/2017 |
| JP | 2006-291259 A | 10/2006 |
| JP | 2007-138224 A | 6/2007 |
| JP | 2010-047802 A | 3/2010 |
| JP | 2010-174372 A | 8/2010 |
| JP | 2011-054647 A | 3/2011 |
| JP | 2014099414 A | 5/2014 |
| JP | 2015-183239 A | 10/2015 |
| JP | 2018-135543 A | 8/2018 |
| KR | 10-2009-0054379 A | 5/2009 |
| KR | 10-2011-0139654 A | 12/2011 |
| KR | 10-2012-0017269 A | 2/2012 |
| KR | 10-2012-0057645 A | 6/2012 |
| KR | 20170134001 A | 12/2017 |
| KR | 10-1870455 B1 | 6/2018 |
| KR | 10-2019-0084455 A | 7/2019 |

OTHER PUBLICATIONS

Written Opinion of the International Searching Authority dated Sep. 30, 2022 in connection with International Patent Application No. PCT/KR2022/008790, 3 pages.
Supplementary European Search Report dated Nov. 5, 2024, in connection with European Patent Application No. 22833487.6, 23 pages.
Office Action issued Apr. 30, 2025, in connection with Korean Patent Application No. 10-2021-0085656, 19 pages.

\* cited by examiner

ELECTRONIC DEVICE INCLUDING PLATE, PLATE, AND METHOD FOR MANUFACTURING PLATE

CROSS-REFERENCE TO RELATED APPLICATIONS

This application is a Bypass Continuation Application of International Application No. PCT/KR2022/008790, which was filed on Jun. 21, 2022, and is based on and claims priority under 35 U.S.C. § 119 to Korean Patent Application No. 10-2021-0085656, which was filed in the Korean Intellectual Property Office on Jun. 30, 2021, the entire disclosure of each of which is incorporated herein by reference.

BACKGROUND

1. Field

Various embodiments of the present disclosure relate to an electronic device including a plate, a plate, and a method for manufacturing a plate.

2. Description of Related Art

Electronic device may refer to a device performing a particular function according to its equipped program, such as a home appliance, an electronic scheduler, a portable multimedia player, a mobile communication terminal, a tablet PC, a video/sound device, a desktop PC or laptop computer, a navigation for automobile, etc. For example, electronic devices may output stored information as voices or images. As electronic devices are highly integrated, and high-speed, high-volume wireless communication becomes commonplace, an electronic device, such as a mobile communication terminal, is recently being equipped with various functions. For example, a smartphone integrates various features for entertainment, e.g., playing video games, multimedia, e.g., playing music/video, communication and security for mobile banking, or as a scheduler or e-wallet, with communication capabilities.

The recent trend to stress on slimness and compactness for smartphones, laptop computers, or other electronic devices leads to an attempt to adopt elegant metallic parts as exterior materials for electronic devices. Further, various surface treatment techniques are being developed to give the metallic exterior material functional effects as well as design effects.

An aluminum material is mainly used as an exterior material of an electronic device. The exterior (e.g., surface) of an aluminum exterior material is implemented by high-gloss specifications and sanding specifications. The high-gloss specifications may be specifications capable of maximizing the gloss of the surface of the exterior material by flattening the surface of the exterior material through a machining process, such as wet polishing or dry polishing, on the surface of the exterior material. The sanding specifications may be specifications for forming the surface of the exterior material by letting sand or ceramic particles hit the surface of the exterior material at a constant pressure or chemically forming the surface of the exterior material through acid or alkali etching.

When the surface of the exterior material is formed by the high gloss specifications or the sanding specifications, the surface of the exterior material may have a uniform texture as a whole, and such an exterior material may not be able to meet the needs of users who want the exterior material having a novel texture.

SUMMARY

Various embodiments of the present disclosure relate to an electronic device including a plate, a plate, and a method for manufacturing a plate, which may provide an exterior material having a partially shiny texture by forming irregular curves on a surface thereof.

Objects of the present disclosure are not limited to the foregoing, and other unmentioned objects would be apparent to one of ordinary skill in the art from the following description.

According to various embodiments of the present disclosure, an electronic device may comprise a housing including a front plate facing in a first direction and a rear plate facing in a second direction opposite to the first direction and a display disposed in the housing and including a screen area exposed through the front plate. At least one of the front plate or the rear plate may include a plate exposed to an outside. The plate may include a metal member including a first metal and an oxide layer formed on at least one surface of the metal member. The metal member may comprise a first portion including irregularities formed by at least one second metal included in a first solution, the at least one second metal being substituted for the a portion of the metal member, the at least one second metal being removed from the metal member by the first solution and a flat second portion etched by the first solution.

According to various embodiments of the present disclosure, a plate may comprise a metal member and an oxide layer formed on at least one surface of the metal member. The metal member may comprise a first portion including irregularities formed by at least one second metal included in a first solution, the at least one second metal being substituted for the a portion of the metal member, the at least one second metal being removed from the metal member by the first solution and a flat second portion etched by the first solution.

According to various embodiments of the present disclosure, a method for manufacturing a plate may comprise a surface forming process for forming a metal member including a first metal, the metal member including a first portion and a second portion, the first portion including irregularities formed by at least one second metal included in a first solution, the at least one second metal being substituted for the a portion of the first metal, the at least one second metal being removed from the metal member by the first solution, a flat second portion being etched by the first solution and an anodizing process for forming an oxide layer formed on at least one surface of the metal member.

According to various embodiments of the present disclosure, an electronic device including a plate, a plate, and a method for manufacturing a plate may provide an exterior material having a partially shiny texture by forming irregular curves on the surface.

Before undertaking the detailed description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
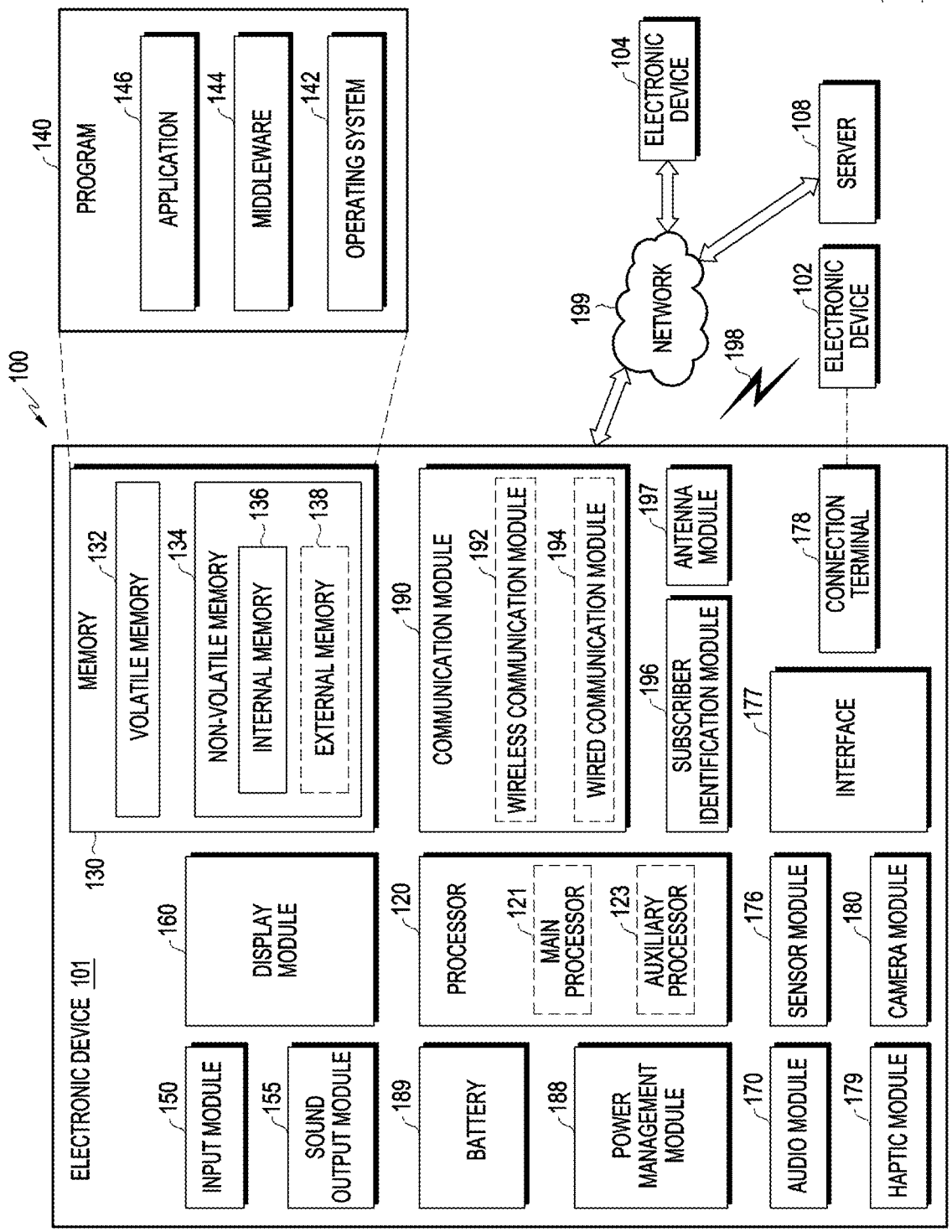
FIG. 1 is a block diagram illustrating an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with at least one of an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
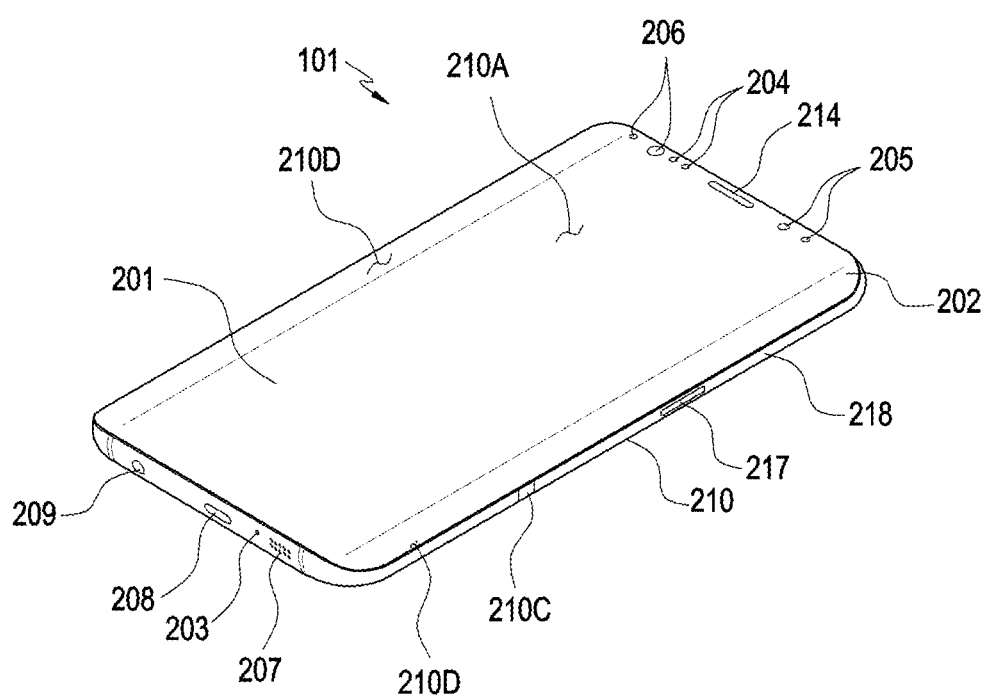
FIG. 2A is a front perspective view illustrating an electronic device according to various embodiments.

FIG. 2A is a front perspective view illustrating an electronic device 101 according to various embodiments.

Figure 2B:
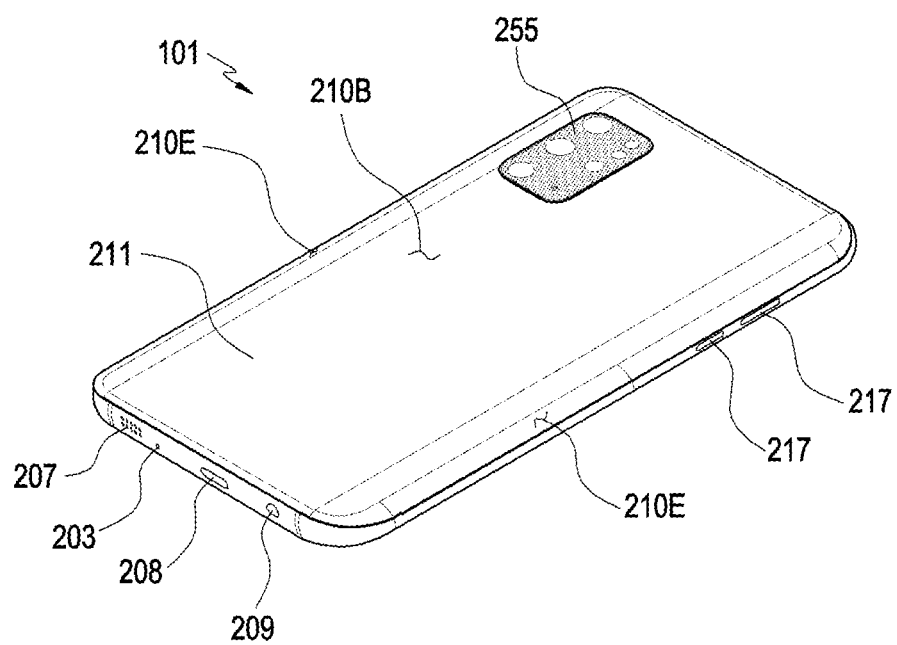
FIG. 2B is a rear perspective view illustrating the electronic device of FIG. 2A, according to various embodiments.

FIG. 2B is a rear perspective view illustrating the electronic device 101 of FIG. 2A, according to various embodiments.

Referring to FIGS. 2A and 2B, according to an embodiment, an electronic device 101 may include a housing 210 including a first surface (or front surface) 210A, a second surface (or rear surface) 210B, and a side surface 210C surrounding a space between the first surface 210A and the second surface 210B. According to another embodiment, the housing may denote a structure forming the first surface 210A of FIG. 2A, the second surface 210B of FIG. 2B, and some of the side surfaces 210C. According to an embodiment, the first surface 210A may be formed by a front plate 202 (e.g., a glass plate or polymer plate with various coat layers) at least part of which is substantially transparent. According to another embodiment, the front plate 202 may be coupled with the housing 210 and, along with the housing 210, may form an internal space. According to various embodiments, the 'internal space' may mean a space, as an internal space of the housing 210, for receiving at least part of the display 201.

According to various embodiments, the second surface 210B may be formed of a substantially opaque rear plate 211. The rear plate 211 may be formed of, e.g., laminated or colored glass, ceramic, polymer, metal (e.g., aluminum, stainless steel (STS), or magnesium), or a combination of at least two thereof. The side surface 210C may be formed by a side bezel structure (or a "side member") 218 that couples to the front plate 202 and the rear plate 211 and includes a metal and/or polymer. According to various embodiments, the rear plate 211 and the side bezel structure 218 may be integrally formed together and include the same material (e.g., a metal, such as aluminum).

In the embodiment illustrated, the front plate 202 may include two first areas 210D (e.g., curved areas), which seamlessly and bendingly extend from the first surface 210A to the rear plate 211, on both the long edges of the front plate 202. In the embodiment illustrated, the rear plate 211 may include two second areas 210E (e.g., curved areas), which seamlessly and bendingly extend from the second surface 210B to the front plate 202, on both the long edges. According to an embodiment, the front plate 202 (or the rear plate 211) may include only one of the first areas 210D (or the second areas 210E). Alternatively, the first areas 210D or the second areas 210E may partially be excluded. According to an embodiment, at a side view of the electronic device 101, the side bezel structure 218 may have a first thickness (or width) for sides (e.g., the side where the connector hole 208 is formed) that do not have the first areas 210D or the second areas 210E and a second thickness, which is smaller than the first thickness, for sides (e.g., the side where the key input device 217 is disposed) that have the first areas 210D or the second areas 210E.

According to an embodiment, the electronic device 101 may include at least one or more of a display 201, audio modules 203, 207, and 214, a sensor module 204, camera modules 205 and 255, a key input device 217, a light emitting device 206, and connector holes 208 and 209. According to various embodiments, the electronic device 101 may exclude at least one (e.g., the key input device 217 or the light emitting device 206) of the components or may add other components.

The display 201 may be visually exposed through a significant portion of the front plate 202. According to an embodiment, at least a portion of the display 201 may be exposed through the front plate 202 forming the first surface 210A and the first areas 210D of the side surface 210C. According to an embodiment, the edge of the display 201 may be formed to be substantially the same in shape as an adjacent outer edge of the front plate 202. According to another embodiment, the interval between the outer edge of the display 201 and the outer edge of the front plate 202 may remain substantially even to give a larger area of exposure the display 201.

According to an embodiment, the surface (or the front plate 202) of the housing 210 may include a screen display area formed as the display 201 is visually exposed. For example, the screen display area may include the front surface 210A and first areas 210D.

According to another embodiment, the screen display area (e.g., the active area) or an area (e.g., the inactive area) separate from the screen display area of the display 201 may have a recess or opening in a portion thereof, and at least one or more of the audio module 214, sensor module 204, camera modules 205 and 255, and light emitting device 206 may be aligned with the recess or opening. According to another embodiment, at least one or more of the audio module 214, sensor module 204, camera modules 205 and 255, and light emitting device 206 may be included on the rear surface of the screen display area of the display 201.

In an embodiment, the electronic device 101 may include a display 201 that is slidably disposed and provides a screen (e.g., a display area). For example, the display area of the electronic device 101 may be an area that is visually exposed and enables an image to be output. For example, the electronic device 101 may adjust the display area according to the movement of a sliding plate or the movement of the display 201. For example, the electronic device 101 may include a rollable electronic device configured to selectively expand the display area as at least a portion (e.g., the housing 210) of the electronic device 101 is operated to be at least partially slidable. The above-described display 201 may be referred to as, e.g., a slide-out display or an expandable display.

According to another embodiment, the display 201 may be disposed to be coupled with, or adjacent, a touch detecting circuit, a pressure sensor capable of measuring the strength (pressure) of touches, and/or a digitizer for detecting a magnetic field-type stylus pen. According to an embodiment, at least part of the sensor modules 204 and/or at least part of the key input devices 217 may be disposed in the first areas 210D and/or the second areas 210E.

The audio modules 203, 207, and 214 may include a microphone hole 203 and speaker holes 207 and 214. The microphone hole 203 may have a microphone inside to obtain external sounds. According to an embodiment, there may be a plurality of microphones to be able to detect the direction of a sound. The speaker holes 207 and 214 may include an external speaker hole 207 and a phone receiver hole 214. According to an embodiment, the speaker holes 207 and 214 and the microphone hole 203 may be implemented as a single hole, or speakers may be rested without the speaker holes 207 and 214 (e.g., piezo speakers).

The sensor module 204 may produce an electrical signal or data value corresponding to the internal operation state or external environment state of the electronic device 101. The sensor module 204 may include a first sensor module 204 (e.g., a proximity sensor) and/or a second sensor module (e.g., a fingerprint sensor) disposed on the first surface 210A of the housing 210 and/or another sensor module (e.g., an HRM sensor or fingerprint sensor) disposed on the second surface 210B of the housing 210. The fingerprint sensor may be disposed on the second surface 210B as well as on the first surface 210A (e.g., the display 201) of the housing 210. The electronic device 101 may include a sensor module, e.g., at least one of a gesture sensor, a gyro sensor, a barometric sensor, a magnetic sensor, an acceleration sensor, a grip sensor, a color sensor, an infrared (IR) sensor, a biometric sensor, a temperature sensor, a humidity sensor, or an illuminance sensor.

The camera modules 205 and 255 may include a first camera module 205 disposed on the first surface 210A of the electronic device 101 and a second camera module 255 disposed on the second surface 210B. The second camera module 255 may include a first component (e.g., an infrared light source), a second component (e.g., an infrared receiver), a flicker detection sensor, and/or a plurality of cameras. The camera modules 205 and 255 may include one or more lenses, an image sensor, and/or an image signal processor. A flash may be disposed on the second surface 210B. The flash may include, e.g., a light emitting diode (LED) and a xenon lamp. According to an embodiment, two or more lenses (an infrared (IR) camera, a wide-angle lens, and a telescopic lens) and image sensors may be disposed ona surface of the electronic device 101.

The key input device 217 may be disposed on the side surface 210C of the housing 210. According to an embodiment, the electronic device 101 may exclude all or some of the above-mentioned key input devices 217 and the excluded key input devices 217 may be implemented in other forms, e.g., as soft keys, on the display 201.

The light emitting device 206 may be disposed on, e.g., the first surface 210A of the housing 210. The light emitting device 206 may provide, e.g., information about the state of the electronic device 101 in the form of light. According to an embodiment, the light emitting device 206 may provide a light source that interacts with, e.g., the camera module 205. The light emitting device 206 may include, e.g., a light emitting diode (LED), an infrared (IR) LED, or a xenon lamp.

The connector holes 208 and 209 may include a first connector hole 208 for receiving a connector (e.g., a universal serial bus (USB) connector) for transmitting or receiving power and/or data to/from an external electronic device and/or a second connector hole 209 (e.g., an earphone jack) for receiving a connector for transmitting or receiving audio signals to/from the external electronic device.

Figure 3:
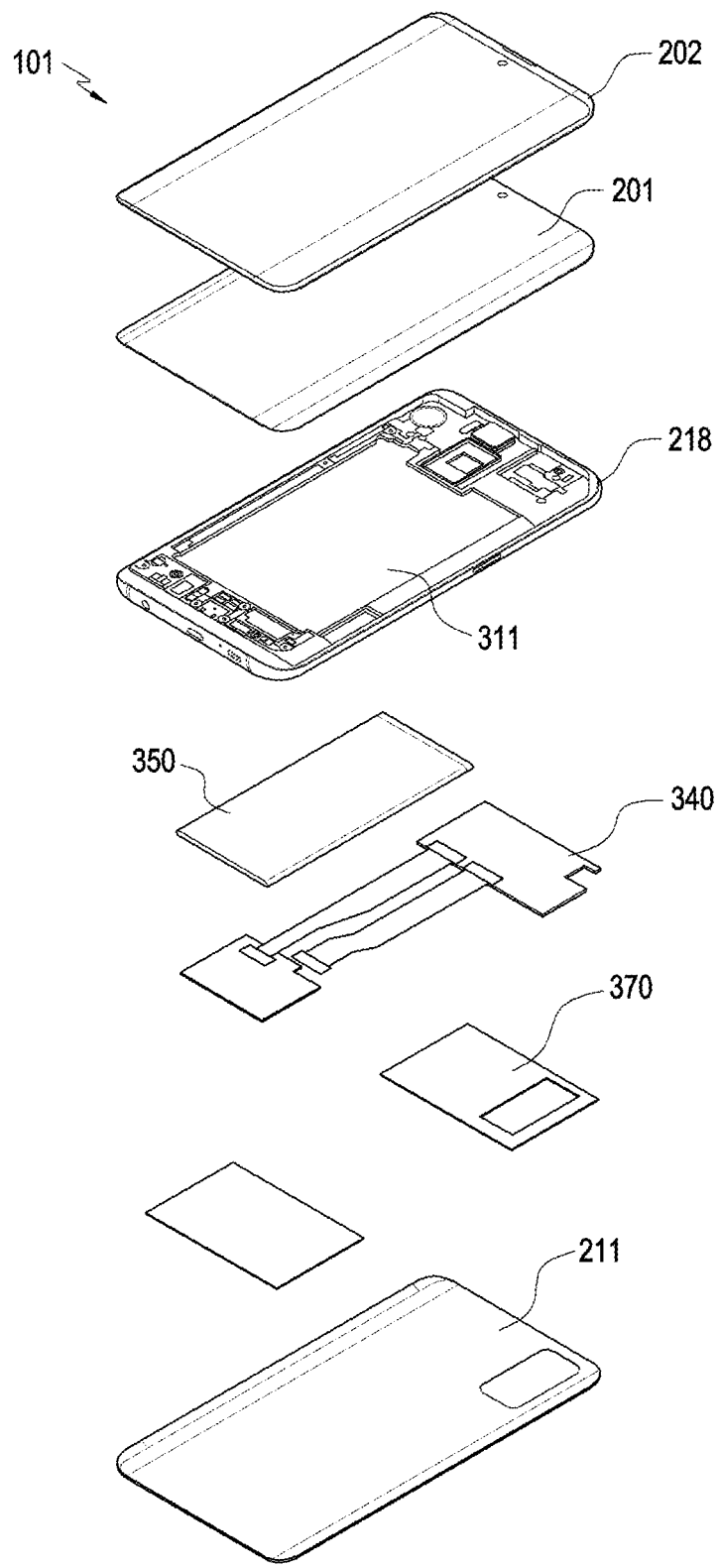
FIG. 3 is an exploded perspective view illustrating an electronic device according to various embodiments.

FIG. 3 is an exploded perspective view illustrating an electronic device 101 according to various embodiments.

Referring to FIG. 3, an electronic device 101 may include a side bezel structure 218, a first supporting member 311 (e.g., a bracket), a front plate 202, a display 201, a printed circuit board 340, a battery 350, an antenna 370, and a rear plate 211. According to an embodiment, the electronic device 101 may exclude at least one (e.g., the first supporting member 311 or a second supporting member) of the components or may add other components. At least one of the components included in the electronic device 101 may be the same or similar to at least one of the components included in the electronic device 101 of FIG. 1, 2A, or 2B and no duplicate description is made below.

The first supporting member 311 may be disposed inside the electronic device 101 to be connected with the side bezel structure 218 or integrated with the side bezel structure 218. The first supporting member 311 may be formed of, e.g., a metal and/or non-metal material (e.g., polymer). The display 201 may be joined onto a surface of the first supporting member 311, and the printed circuit board 340 may be joined onto an opposite surface of the first supporting member 311. A processor, memory, and/or interface may be mounted on the printed circuit board 340. The processor may include one or more of, e.g., a central processing unit, an application processor, a graphic processing device, an image signal processing, a sensor hub processor, or a communication processor.

The memory may include, e.g., a volatile or non-volatile memory.

The interface may include, e.g., a high definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

The battery 350 may be a device for supplying power to at least one component of the electronic device 101. The battery 189 may include, e.g., a primary cell which is not rechargeable, a secondary cell which is rechargeable, or a fuel cell. At least a portion of the battery 350 may be disposed on substantially the same plane as the printed circuit board 340. The battery 350 may be integrally or detachably disposed inside the electronic device 101.

The antenna 370 may be disposed between the rear plate 211 and the battery 350. The antenna 370 may include, e.g., a near-field communication (NFC) antenna, a wireless charging antenna, and/or a magnetic secure transmission (MST) antenna. The antenna 370 may perform short-range communication with, e.g., an external device or may wirelessly transmit or receive power necessary for charging. According to an embodiment, an antenna structure may be formed by a portion or combination of the side bezel structure 218 and/or the first supporting member 311.

Figure 4:
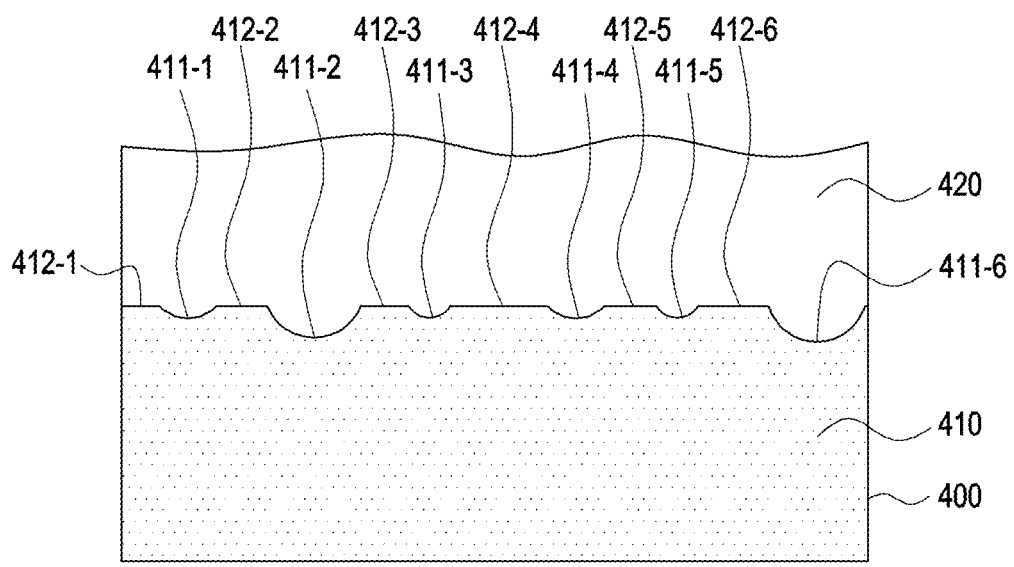
FIG. 4 is a view illustrating a plate according to various embodiments.

FIG. 4 is a view illustrating a plate 400 according to various embodiments. For example, FIG. 4 may be a view illustrating a cross section of a portion of the plate 400.

Referring to FIG. 4, in an embodiment, the plate 400 may be at least a portion of a front plate (e.g., the front plate 202 of FIG. 3) and/or at least a portion of a rear plate (e.g., the rear plate 211 of FIG. 3). However, a configuration that may be implemented by the plate 400 is not limited to the above-described front plate and rear plate. For example, the plate 400 may be implemented as at least a portion of an external cover of the electronic device 101. In an embodiment, at least a portion of the plate 400 (e.g., at least one surface of the plate 400) may be exposed (e.g., visually) to the outside.

In an embodiment, the plate 400 may include a metal member 410 and an oxide layer 420.

In an embodiment, the metal member 410 may be implemented of aluminum (e.g., an aluminum material) or an aluminum alloy. However, the metal for implementing the metal member 410 is not limited to aluminum or an aluminum alloy. For example, the metal member 410 may be implemented of magnesium, titanium, and/or stainless steel.

In an embodiment, at least one surface (e.g., at least a portion of the surface of the metal member 410) of the metal member 410 may include a first portion with irregularities (hereinafter, used interchangeably with "first portion") and a flat second portion (hereinafter, used interchangeably with "second portion"). In an embodiment, the first portion may be a portion including the irregularities 411-1, 411-2, 411-3, 411-4, 411-5, and 411-6 locally formed on the surface of the metal member 410, and the second portion may be portions 412-1, 412-2, 412-3, 412-4, 412-5, and 412-6 except for the first portion in the surface of the metal member 410.

In an embodiment, the first portion may include protruding or depressed portions in the surface of the metal member 410. For example, the first portion may include protruding portions and depressed portions irregularly (or non-uniformly) formed in the surface of the metal member 410.

In an embodiment, the first portion may be irregularly formed in the metal member 410. For example, the intervals between the irregularities included in the first portion may be irregular. As another example, some of the irregularities included in the first portion may be formed to be continuous to each other.

In an embodiment, the irregularities included in the first portion may have various (e.g., irregular) diameters. For example, as shown in FIG. 4, an irregularity 411-1, an irregularity 411-2, and an irregularity 411-3 may have different diameters.

In an embodiment, the number of irregularities per unit area in the first portion may vary depending on positions where the plurality of irregularities are distributed.

In an embodiment, the second portion may be portions 412-1 to 412-6 formed to be flat (e.g., formed to be gently inclined) in the metal member 410.

In an embodiment, as illustrated in FIG. 4, the first portion may be formed in a lower position than the second portion as shown in FIG. 4. For example, the thickness of the first portion may be smaller than the thickness of the second portion. As another example, the height of the first portion may be smaller than the height of the second part.

In an embodiment, the gloss of the first portion may be different from the gloss of the second portion. In an embodiment, the gloss level of the first portion may be lower than the gloss level of the second portion. For example, since the light incident on the first portion may be diffusely reflected by the irregularities included in the first portion, the gloss level of the first portion may be lower than that of the second portion which is flat. In an embodiment, in the first portion, the gloss level of the portions having irregularities with a first diameter may be lower than the gloss level of the portions having irregularities with a second diameter.

In an embodiment, the oxide layer 420 may be formed on at least one surface of the metal member 410. For example, the oxide layer 420 may be formed by oxidizing the surface of the metal member 410.

In an embodiment, the shape of one surface of the oxide layer 420 may correspond to the shape of one surface of the metal member 410 as shown in FIG. 4.

In an embodiment, the oxide layer 420 may be implemented in various colors by a coloring process to be described below.

In FIG. 4, the plate 400 is exemplified as including the metal member 410 and the oxide layer 420 but is not limited thereto. For example, the plate 400 may further include at least one coating layer (not shown) formed by coating one surface of the oxide layer 420 in addition to the metal member 410 and the oxide layer 420. In an embodiment, the coating layer may include, e.g., a strength reinforcing coating (or film) and/or an anti-fingerprint (AF) coating. In an embodiment, a strength reinforcing coating may be disposed to reinforce the strength of the plate 400. In an embodiment, the AF coating may be disposed on the oxide layer 420 or on the strength reinforcing coating layer to prevent contamination of the plate 400. However, it is not limited by the above-described example.

Figure 5:
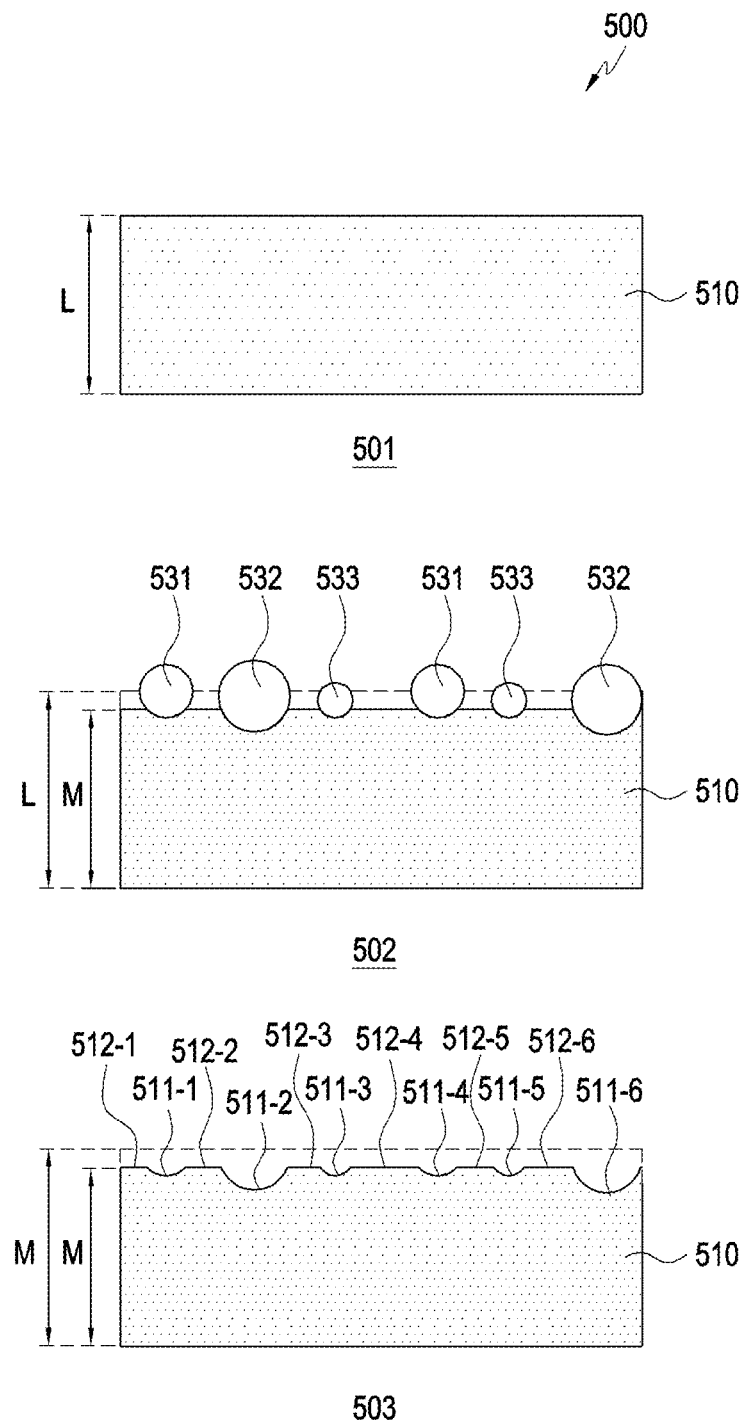
FIG. 5 is a view illustrating a method for forming a metal member according to various embodiments.

FIG. 5 is a view 500 illustrating a method for forming a metal member 510 (e.g., the metal member 410 of FIG. 4) according to various embodiments.

Referring to FIG. 5, in an embodiment, reference numeral 501 may denote a metal member 510 before performing a surface forming process. For example, reference numeral 501 may denote a metal member 510 formed by performing a machining, polishing, and degreasing, which are described below, on a metal material (e.g., aluminum).

In an embodiment, a surface forming process of immersing the metal member 510 in a designated solution may be performed.

In an embodiment, the designated solution in which the metal member 510 is immersed (hereinafter, referred to as a 'first solution') may be an acidic solution or an alkaline solution including (e.g., containing) at least one metal (hereinafter, interchangeably used with 'at least one second metal') that is capable of a substitution reaction with the metal (e.g., aluminum) (hereinafter, interchangeably used with 'first metal') constituting the metal member 510.

In an embodiment, the first solution may include at least one of nitric acid, sulfuric acid, oxalic acid, phosphoric acid, or chromic acid together with the at least one second metal and may be an acidic solution having a concentration range from about 50% to about 100%. In an embodiment, using a first solution including two or more acidic solutions (e.g., two or more acidic ions) among nitric acid, sulfuric acid, oxalic acid, phosphoric acid may form a metal member with a first portion with more irregular irregularities than using a first solution including one acidic solution (e.g., one acidic ion) among nitric acid, sulfuric acid, oxalic acid, phosphoric acid, or chromic acid together with at least one second metal.

In an embodiment, the first solution may include at least one of sodium hydroxide, potassium hydroxide, sodium carbonate, or sodium phosphate together with the at least one second metal and may be an alkaline solution having a concentration range from about 5% to about 80%. In an embodiment, using a first solution including two or more alkaline solutions (e.g., two or more alkaline ions) among sodium hydroxide, potassium hydroxide, sodium carbonate, or sodium phosphate together with at least one second metal may form a metal member having a first portion with more irregular irregularities than using a first solution including one alkaline solution (e.g., one alkaline ion) among sodium hydroxide, potassium hydroxide, sodium carbonate, or sodium phosphate together with at least one second metal.

In an embodiment, at least one second metal (hereinafter also referred to as 'at least one substitution metal') capable of a substitution reaction with the first metal may be a metal that has a lower ionization tendency than the first metal (e.g., aluminum). For example, when the first metal is aluminum, the at least one second metal may be at least one of zinc, iron, copper, nickel, or silver. In an embodiment, in the surface forming process, at least one second metal having a concentration range from about 0.1% to about 10% in the first solution may be used.

In an embodiment, reference numeral 502 and reference numeral 503 denote a substitution reaction and an etching process, respectively, which are caused by immersing the metal member 510 in the first solution. In an embodiment, the substitution reaction and the etching process may be included in the surface forming process.

In an embodiment, when the metal member 510 is immersed in the first solution, the first metal constituting the metal member 510 may be substituted with at least one second metal included in the first solution. When the first metal constituting the metal member 510 is substituted with at least one second metal included in the first solution, at least one second metal 531, 532, and 533 may be deposited on at least one portion of the surface of the metal member 510.

In an embodiment, since the at least one deposited second metal 531, 532, and 533 remain in an unstable state after deposition, it may be etched by acidic ions or alkaline ions included in the first solution. For example, the at least one deposited second metal 531, 532, and 533 may be removed from the metal member 510 by the acidic ions or alkaline ions included in the first solution, as shown by reference numeral 503.

In an embodiment, when the at least one deposited second metal 531, 532, and 533 is etched, irregularities may be formed where the at least one second metal 531, 532, and 533 was deposited and then bonded with the metal member 510. For example, when the at least one deposited second metal 531, 532, and 533 is etched, the first portion including the irregularities 511-1, 511-2, 511-3, 511-4, 511-5, and 511-6 may be formed as shown by reference numeral 503.

In an embodiment, when the metal member 510 is immersed in the first solution, a portion of the surface of the metal member 510 may be etched, as shown by reference numeral 502. For example, a portion of the metal member 510 in which the substitution reaction does not occur may be etched by acidic ions or alkaline ions included in the first solution.

In an embodiment, when the portion of the metal member 510 in which a substitution reaction does not occur is etched by acid ions or alkaline ions included in the first solution, flat portions may be formed. For example, when the portion in the metal member 510 in which the substitution reaction does not occur is etched by acid ions or alkaline ions included in the first solution, a second portion including flat portions 512-1, 512-2, 512-3, 512-4, 512-5, and 512-6 may be formed as shown in reference numeral 503.

In an embodiment, the thickness of the second portion formed to be flat may be smaller than the thickness of the metal material before the surface forming process. For example, as shown by reference numerals 501 to 503, the thickness M of the flat second portion may be smaller than the thickness L of the metal material before the surface forming process.

In an embodiment, the thickness of the first portion may be smaller than the thickness of the second portion. For example, the thicknesses of the irregularities 511-1 to 511-6 included in the first portion may be smaller than the thicknesses of the flat portions 512-1 to 512-6 included in the second portion.

In an embodiment, the surface forming process may be performed in a temperature range from about 50° C. to about 150° C. In an embodiment, the surface forming process may be performed within a time range from about 10 seconds to about 30 minutes.

In an embodiment, the scheme of forming the metal member 510 including the first portion and the second portion by the surface forming process of immersing the metal member in the first solution, as described above, may shorten the process as compared with the conventional scheme of forming a metal member having a uniform surface by blasting and chemical polishing.

Figure 6:
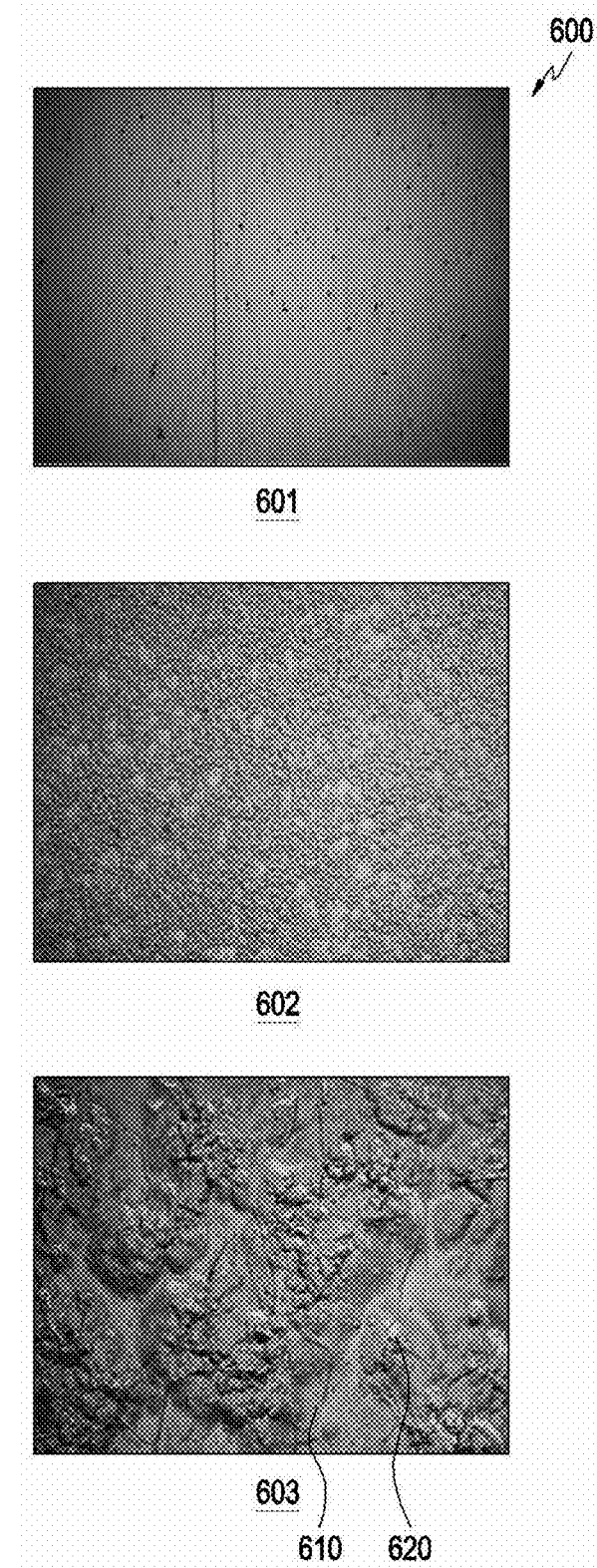
FIG. 6 is a view illustrating a surface of a metal member according to various embodiments.

FIG. 6 is a view 600 illustrating a surface of a metal member according to various embodiments.

Referring to FIG. 6, in an embodiment, reference numeral 601 may be a view illustrating a surface of a metal member implemented according to comparative example 1. For example, the metal member implemented by comparative example 1 (hereinafter, referred to as a 'metal member of comparative example 1') may be a metal member in a state before performing the above-described surface forming process.

In an embodiment, reference numeral 602 may be a view illustrating a surface of a metal member implemented by comparative example 2. For example, in the metal member implemented by comparative example 2 (hereinafter, referred to as 'metal member of comparative example 2'), as the first metal (e.g., aluminum) constituting the metal member is substituted by at least one second metal, at least one second metal may be deposited on the surface of the metal member and may then remain bonded to the surface of the metal member without being removed. For example, the metal member of comparative example 2 may be a member in a state in which at least one second metal is coated on the metal member formed of the first metal.

In an embodiment, reference numeral 603 may be a view illustrating a surface of a metal member as described with reference to FIGS. 4 and 5 (hereinafter, referred to as a 'metal member of the disclosure').

Comparison between reference numerals 601 to 603 reveals that, in an embodiment, the metal member of comparative example 1 and the metal member of comparative example 2 each may have uniformly formed surfaces. For example, the metal member of comparative example 1, as a metal member formed of the first metal, may have a uniformly formed surface. As another example, the metal member of comparative example 2 may have a surface having at least one second metal uniformly applied, on the metal member formed of the first metal.

In an embodiment, unlike the metal member of comparative example 1 and the metal member of comparative example 2, the metal member of the disclosure may have a non-uniform surface. For example, as the at least one second metal which has been deposited by the substitution reaction is removed, irregular curves may be formed on the surface of the metal member of the disclosure. As another example, as shown by reference numeral 603, a first portion including irregularities (e.g., irregularity 620) and a second portion including gently inclined portions (e.g., portion 610) may be formed on the surface of the metal member of the disclosure.

Figure 7:
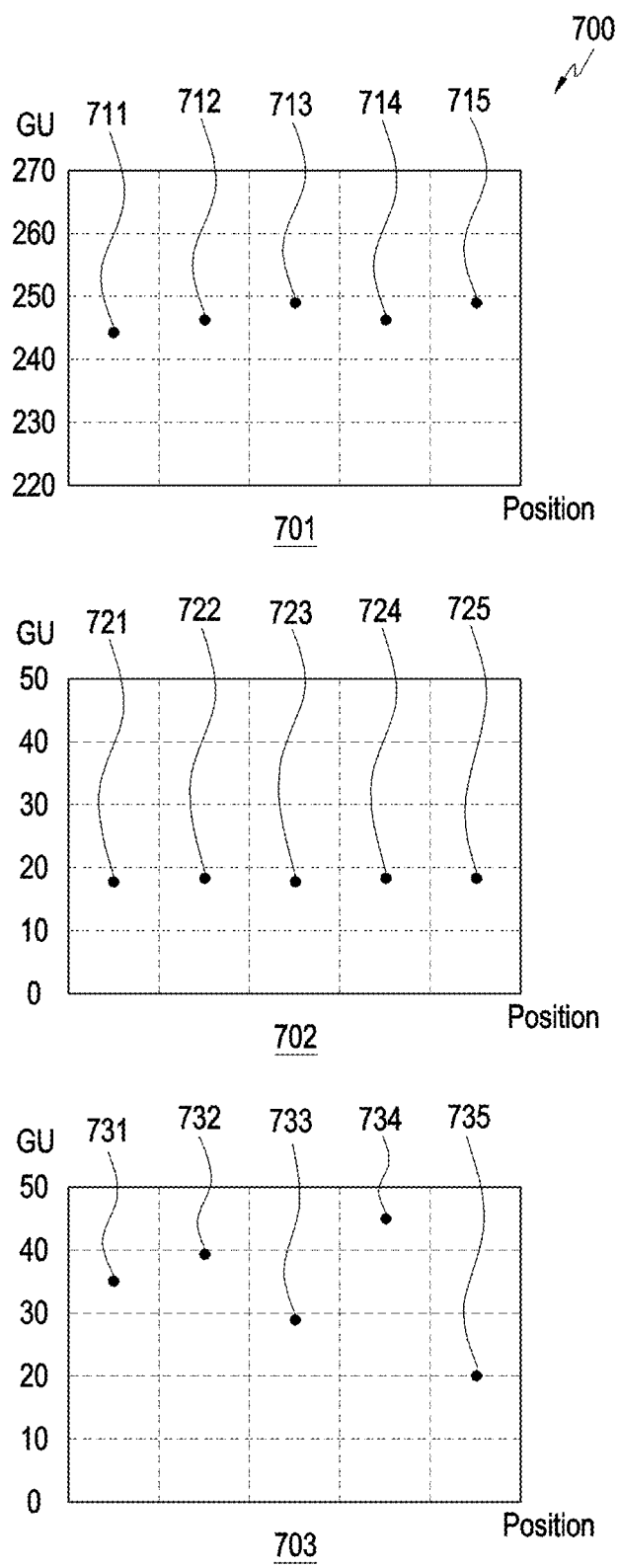
FIG. 7 is a view illustrating the gloss of a plate according to various embodiments.

FIG. 7 is a view 700 illustrating the gloss of a plate 400 according to various embodiments.

Referring to FIG. 7, in an embodiment, reference numeral 701 may show gloss levels measured in different positions (or portions) of a metal member (or plate including a metal member) (e.g., 601 of FIG. 6) implemented by comparative example 1.

In an embodiment, reference numeral 702 may show gloss levels measured in different positions of a metal member (e.g., 602 of FIG. 6) implemented by comparative example 2.

In an embodiment, reference numeral 703 may show gloss levels measured in different positions of a metal member 410 (e.g., 603 of FIG. 6) implemented by the disclosure.

Reference numeral 701 to reference numeral 703 are compared. In an embodiment, the gloss levels 711, 712, 713, 714, and 715 measured in different positions of the metal member implemented by comparative example 1 may be in the gloss range from about 240 gloss unit (GU) to about 250 GU as shown by reference numeral 701.

In an embodiment, the gloss levels 721, 722, 723, 724, and 725 measured in different positions of the metal member implemented by comparative example 2 may be in the gloss range from about 10 GU to about 15 GU as shown by reference numeral 702.

In an embodiment, the gloss levels 731, 732, 733, 734, and 735 measured in different positions of the metal member implemented by the disclosure may be in the gloss range from about 15 GU to about 45 GU as shown by reference numeral 703.

In an embodiment, the gloss range (about 15 GU to about 45 GU) of the metal member 410 implemented by the disclosure may be wider than the gloss range (about 240 GU to about 250 GU) of the metal member implemented by comparative example 1 and the gloss range (about 15 GU to about 20 GU) of the metal member implemented by comparative example 2 as shown by reference numerals 701 to 703. In an embodiment, the deviation between the gloss levels measured in different positions of the metal member implemented by the disclosure may be larger than the deviation between the gloss levels measured in different positions of each of the metal members implemented by comparative example 1 and comparative example 2. In an embodiment, an increased deviation between the gloss levels measured in different positions of the metal member 410 implemented by the disclosure may implement a partially shinny texture on the surface of the plate.

Figure 8:
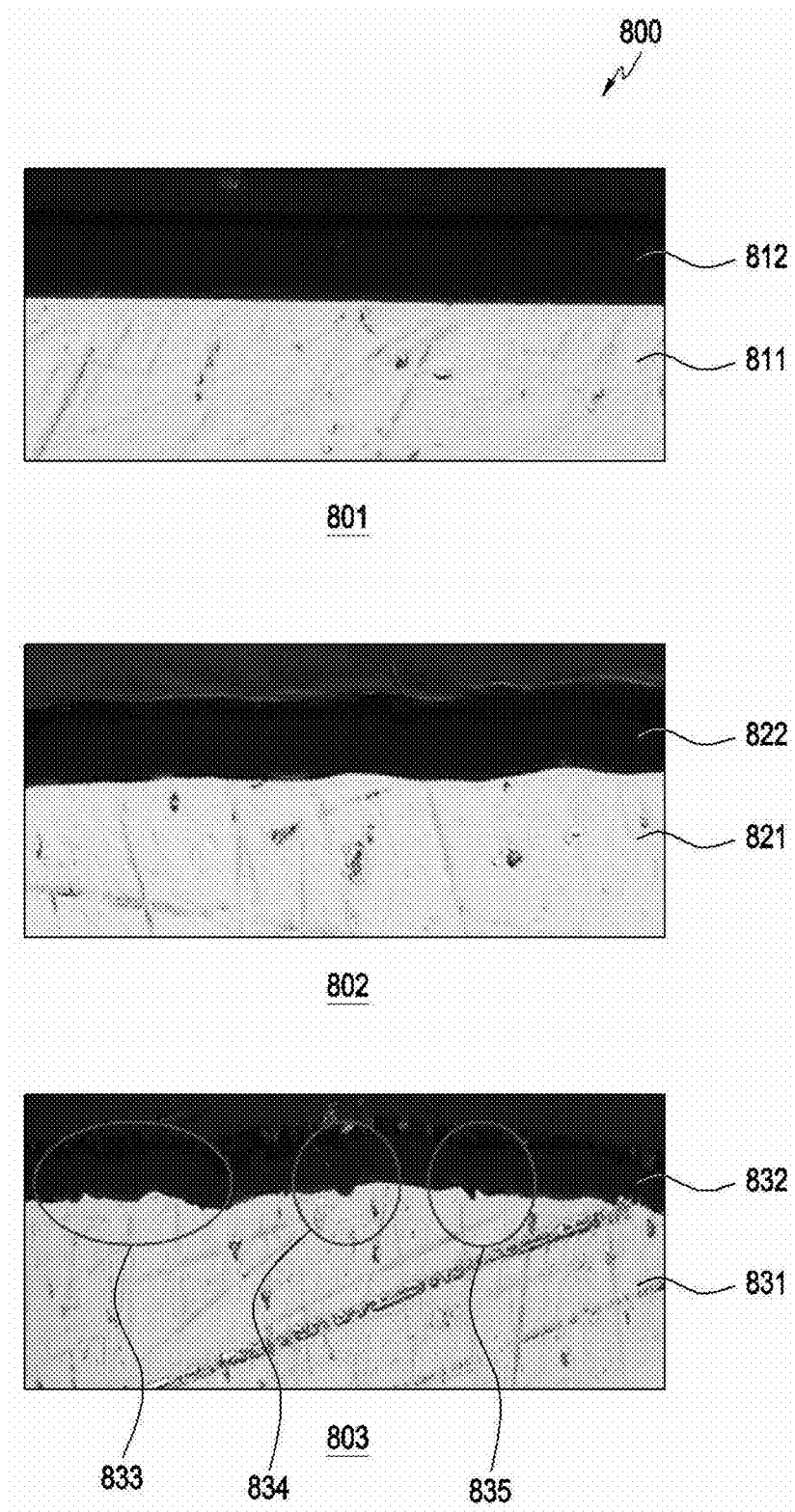
FIG. 8 is a view illustrating a cross section of a plate according to various embodiments.

FIG. 8 is a view 800 illustrating a cross section of a plate 400 according to various embodiments.

Referring to FIG. 8, in an embodiment, reference numeral 801 may illustrate a cross section of a plate in which an oxide layer 812 is formed on a metal member 811 implemented by comparative example 1. As shown by reference numeral 801, the metal member 811 may have only a flat surface.

In an embodiment, reference numeral 802 may show a cross section of a plate in which an oxide layer 822 is formed on a metal member 821 implemented by comparative example 2. As shown by reference numeral 802, the metal member 821 may have a surface formed with gentle and constant (regular) curves overall.

In an embodiment, reference numeral 803 may show a cross section of a plate 400 in which an oxide layer 832 is formed on a metal member 831 implemented by the disclosure. The surface of the metal member 831 may have a first portion including irregularities indicated by circles 833, 834, and 835 in reference numeral 803 and a second portion formed to be flat. In an embodiment, a lower gloss level may be measured in the first portion including the irregularities, and a higher gloss level may be measured in the flat second portion. In an embodiment, the gloss level measured in portions with irregularities larger in size (e.g., diameter) in the first portion may be lower than the gloss level measured in portions with irregularities smaller in size.

Figure 9:
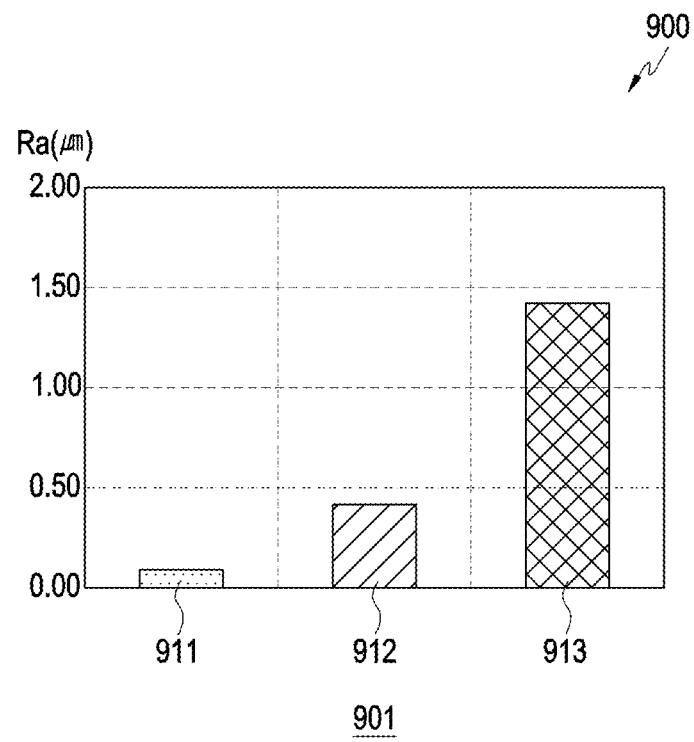
FIG. 9 is a view illustrating the roughness of a metal member according to various embodiments.
Figure 9:
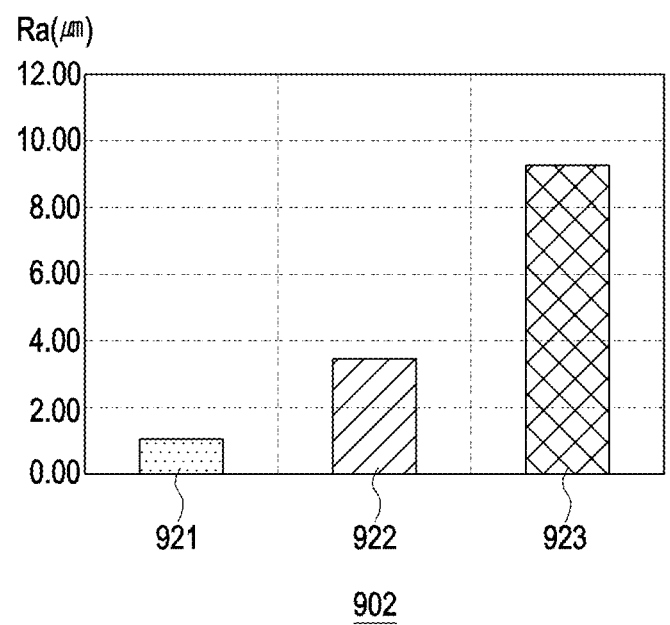

FIG. 9 is a view 900 illustrating the roughness (surface roughness) of a metal member 410 according to various embodiments.

Referring to FIG. 9, in an embodiment, reference numeral 901 may show the calculated average roughness Ra of a metal member implemented by comparative example 1, a metal member implemented by comparative example 2, and a metal member implemented by the disclosure.

In an embodiment, as shown by reference numeral 901, the calculated average roughness 911 of the surface of the metal member implemented by comparative example 1 may be about 0.058 µm, the calculated average roughness 912 of the surface of the metal member implemented by comparative example 2 may be about 0.434 µm, and the calculated average roughness 913 of the surface of the metal member 410 implemented by the disclosure may be about 1.474 µm.

In an embodiment, as shown by reference numeral 901, the calculated average roughness (about 1.474 µm) of the surface of the metal member 410 implemented by the disclosure may be about 24 times the calculated average roughness (about 0.058 µm) of the surface of the metal member implemented by comparative example 1 and about three times the calculated average roughness (about 0.434 µm) of the surface of the metal member implemented by comparative example 2.

In an embodiment, reference numeral 902 may show the 10-point average roughness Rz of the metal member implemented by comparative example 1, the metal member implemented by comparative example 2, and the metal member implemented by the disclosure.

In an embodiment, as shown by reference numeral 902, the 10-point average roughness 921 of the surface of the metal member implemented by comparative example 1 may be about 0.910 µm, the 10-point average roughness 922 of the surface of the metal member implemented by comparative example 2 may be about 3.517 µm, and the 10-point average roughness 923 of the surface of the metal member 410 implemented by the disclosure may be about 9.656 µm.

In an embodiment, as shown by reference numeral 903, the 10-point average roughness (about 9.656 µm) of the surface of the metal member 410 implemented by the disclosure may be about 10.6 times the 10-point average roughness (about 0.910 µm) of the surface of the metal member implemented by comparative example 1 and about 2.7 times the 10-point average roughness (about 3.517 µm) of the surface of the metal member implemented by comparative example 2.

In an embodiment, the roughness of the first portion in the metal member 410 implemented by the disclosure may be larger than the roughness of the second portion.

In an embodiment, as described above, the roughness of the metal member 410 implemented by the disclosure may be larger than the roughness of the metal member implemented by comparative example 1 and the roughness of the metal member implemented by comparative example 2. Accordingly, the surface of the metal member 410 implemented by the disclosure may have a texture different from the texture of the surface of the metal member implemented by comparative example 1 and the texture of the metal member implemented by comparative example 2.

Figure 10:
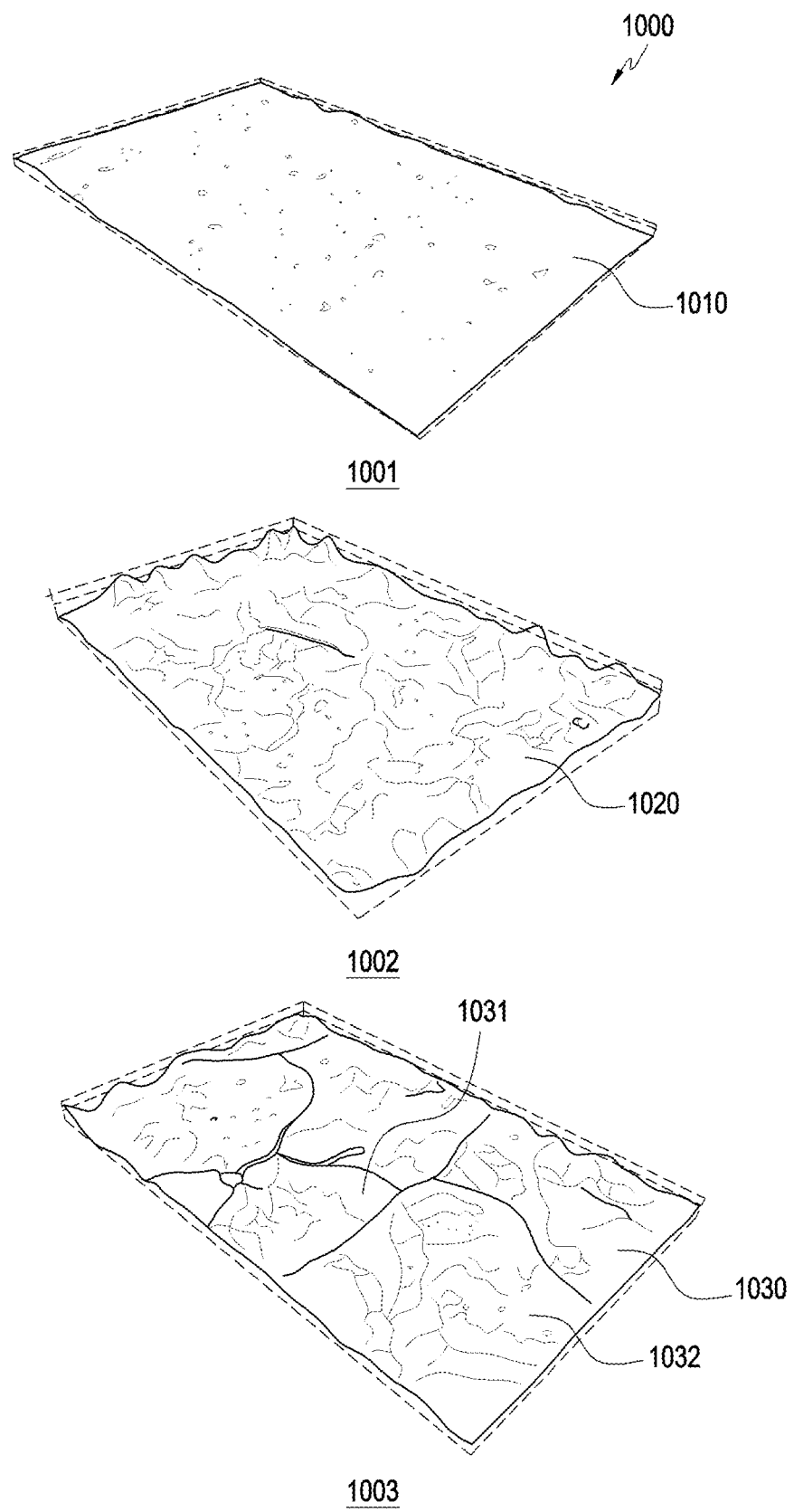
FIG. 10 is a view illustrating a surface of a metal member according to various embodiments.

FIG. 10 is a view 1000 illustrating a surface of a metal member according to various embodiments.

Referring to FIG. 10, in an embodiment, reference numeral 1001 may denote a surface 1010 of a metal member implemented by comparative example 1, reference numeral 1002 may denote a surface 1020 of a metal member implemented by comparative example 2, and reference numeral 1003 may denote a surface 1030 of a metal member 410 implemented by the disclosure.

In an embodiment, the deviation in height (height or thickness) of the surface 1030 of the metal member 410 implemented by the disclosure may be larger than the deviation in height of the surface 1010 of the metal member implemented by comparative example 1 and the deviation in height of the surface 1020 of the metal member implemented by comparative example 2.

In an embodiment, the maximum value of the height of the surface 1010 of the metal member implemented by comparative example 1 may be about 4.3 µm, and the minimum value thereof may be about 3.5 µm. The deviation in height of the surface 1010 of the metal member implemented by comparative example 1 may be about 0.8 µm.

In an embodiment, the maximum value of the height of the surface 1020 of the metal member implemented by comparative example 2 may be about 8.9 µm, and the minimum value thereof may be about 6.2 µm. The deviation in height of the surface 1020 of the metal member implemented by comparative example 2 may be about 2.7 µm.

In an embodiment, the maximum value of the height of the surface 1030 of the metal member 410 implemented by the disclosure may be about 11.4 µm, and the minimum value thereof may be about 3.7 µm. The deviation in height of the surface 1030 of the metal member 410 implemented by the disclosure may be about 7.7 µm. In an embodiment, as shown by reference numeral 1003, the position 1031 in which the maximum value of the height of the surface 1030 of the metal member 410 implemented by the disclosure is measured may be the position of one of the portions to be included in the second portion formed to be flat, and the position 1032 in which the minimum value of the height of the surface 1030 of the metal member 410 implemented by the disclosure is measured may be the position of one of the irregularities included in the first portion.

In an embodiment, the deviation (about 7.7 µm) of height of the surface 1030 of the metal member 410 implemented by the disclosure may be about 9.6 times the deviation (about 0.8 µm) in height of the surface 1010 of the metal member implemented by comparative example 1 and about 2.9 times the deviation (about 2.7 µm) in height of the surface 1020 of the metal member implemented by comparative example 2.

In an embodiment, since the deviation in height of the surface 1030 of the metal member 410 implemented by the disclosure is larger than the deviation in height of the surface 1010 of the metal member implemented by comparative example 1 and the deviation in height of the surface 1020 of the metal member implemented by comparative example 2, the surface 1030 of the metal member 410 implemented by the disclosure may have a curve with a larger height than a curve of the surface 1010 of the metal member implemented by comparative example 1 and a curve of the surface 1020 of the metal member implemented by comparative example 2.

In an embodiment, the range in number of the irregularities included in a unit area (e.g., 1 cm2) of the surface of the metal member 410 implemented by the disclosure may be larger than the range in number of the irregularities included in the unit area of the metal member implemented by comparative example 2.

In an embodiment, the metal member implemented by comparative example 1 may include substantially no irregularity. In an embodiment, the number of irregularities included in the unit area of the metal member implemented by comparative example 2 may range from about 140 to about 165. In an embodiment, the number of irregularities included in the unit area of the metal member 410 implemented by the disclosure may range from about 15 to about 65.

In an embodiment, since the range in number of the irregularities included in the unit area of the surface of the metal member 410 implemented by the disclosure is larger than the range in number of the irregularities included in the unit area of the metal member implemented by comparative example 2, it may be identified that the irregularities are regularly (uniformly) formed on the surface of the metal member implemented by comparative example 2 whereas irregularities are irregularly (non-uniformly) formed on the surface of the metal member 410 implemented by the disclosure.

In an embodiment, as the at least one second metal, deposited by the substitution reaction, exists on the surface of the metal member 410 implemented by the disclosure, and the at least one second metal, deposited by the substitution reaction, does not exist on the surface of the metal member implemented by comparative example 2, the number of the irregularities included in the unit area of the metal member 410 implemented by the disclosure may be smaller than the number of the irregularities included in the unit area of the metal member implemented by comparative example 2.

In an embodiment, the irregularities included in the first portion of the metal member 410 implemented by the disclosure may be distributed irregularly on the surface of the metal member 410.

In an embodiment, the deviation in diameter of the irregularities formed on the surface of the metal member 410 implemented by the disclosure may be larger than the deviation in diameter of the irregularities formed on the surface of the metal member implemented by comparative example 2.

In an embodiment, the metal member implemented by comparative example 1 may include substantially no irregularity. In an embodiment, the minimum value of the diameters of the irregularities formed on the surface 1020 of the metal member implemented by comparative example 2 may be about 35 µm, and the maximum value thereof may be about 45 µm. The deviation in diameter of the irregularities formed on the surface 1020 of the metal member implemented by comparative example 2 may be about 10 µm. In an embodiment, the minimum value of the diameters of the irregularities formed on the surface 1030 of the metal member 410 implemented by the disclosure may be about 30 µm, and the maximum value thereof may be about 215 µm. The deviation in diameter of the irregularities formed on the surface 1030 of the metal member 410 implemented by the disclosure may be about 185 µm.

In an embodiment, since the deviation in diameter of the irregularities formed on the surface 1030 of the metal member 410 implemented by the disclosure is larger than the deviation in diameter of the irregularities formed on the surface 1020 of the metal member implemented by comparative example 2, it may be identified that irregularities are regularly (uniformly) formed on the surface 1020 of the metal member implemented by comparative example 2 whereas irregularities are irregularly (non-uniformly) formed on the surface 1030 of the metal member 410 implemented by the disclosure.

According to various embodiments of the present disclosure, an electronic device 101 may comprise a housing (e.g., the housing 210 of FIG. 2) including a front plate (e.g., the front plate 202 of FIG. 3) facing in a first direction and a rear plate (e.g., the rear plate 211 of FIG. 3) facing in a second direction opposite to the first direction and a display (e.g., the display module 160 of FIG. 1) disposed in the housing and including a screen area exposed through the front plate. At least one of the front plate 202 or the rear plate 211 may include a plate 400 exposed to an outside. The plate 400 (e.g., the plate 400 of FIG. 4) may comprise a metal member 410 (e.g., the metal member 410 of FIG. 4) and an oxide layer 420 (e.g., the oxide layer 420 of FIG. 4) formed on at least one surface of the metal member 410. The metal member 410 may include a first portion including irregularities formed by at least one second metal included in a first solution, the at least one second metal being substituted for the a portion of the metal member 410, the at least one second metal being removed from the metal member by the first solution and a flat second portion etched by the first solution.

According to various embodiments, a thickness of the first portion may be smaller than a thickness of the flat second portion.

According to various embodiments, a gloss level of the first portion may be lower than a gloss level of the flat second portion.

According to various embodiments, the plate 400 may have a gloss level range from 15 gloss unit (GU) to 45 GU depending on a position in the plate 400.

According to various embodiments, a roughness of the first portion may be larger than a roughness of the flat second portion.

According to various embodiments, the irregularities included in the first portion may be irregularly distributed on a surface of the metal member 410.

According to various embodiments, 15 to 65 irregularities may be included in a unit area of the metal member 410. A diameter of the irregularities may be in a range from 30 µm to 215 µm.

According to various embodiments, the first solution may include, together with the at least one second metal, at least one of nitric acid, sulfuric acid, oxalic acid, phosphoric acid, or chromic acid having a concentration in a range from 50% to 100% or at least one of sodium hydroxide, potassium hydroxide, sodium carbonate, or sodium phosphate having a concentration in a range from 5% to 80%.

According to various embodiments, the first metal may be aluminum and an aluminum alloy. The at least one second metal may be at least one metal having an ionization tendency lower than an ionization tendency of the aluminum. A concentration of the at least one second metal included in the first solution may be in a range from 0.1% to 10%.

According to various embodiments, the electronic device 101 may further comprise a coating layer disposed on the oxide layer 420.

According to various embodiments of the present disclosure, a plate 400 may comprise a metal member 410 and an oxide layer 420 formed on at least one surface of the metal member 410. The metal member 410 may comprise a first portion including irregularities formed by at least one second metal included in a first solution, the at least one second metal being substituted for the a portion of the metal member 410, the at least one second metal being removed from the metal member by the first solution and a flat second portion etched by the first solution.

Figure 11:
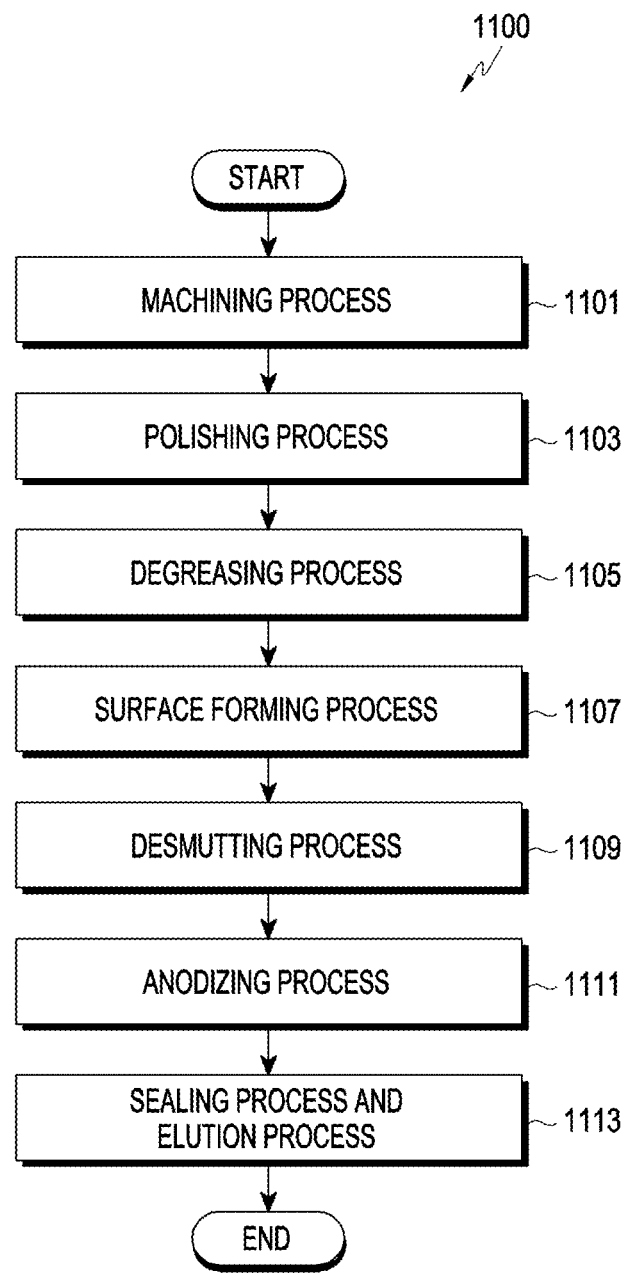
FIG. 11 is a view illustrating a method for manufacturing a plate according to various embodiments.

FIG. 11 is a view 1100 illustrating a method for manufacturing a plate according to various embodiments.

Referring to FIG. 11, in an embodiment, a machining process 1101 may be a process for implementing a metal member 410 in a designed shape. For example, the machining process 1101 may be a process for implementing the metal member 410 having a designed shape through pressing, casting, or cutting.

In an embodiment, the polishing process 1103 may be a process for minimizing the roughness (e.g., the degree of irregularities or surface roughness) of the surface of the metal member 410 processed through the machining process 1101. For example, the polishing process 1103 may be divided into wet polishing and dry polishing depending on conditions (or environments). As the surface of the processed metal member 410 is flattened by the polishing process 1103, the surface of the metal member 410 may be implemented with a gloss.

In an embodiment, the degreasing process 1105 may be a process for removing foreign substances, such as a cutting oil from the machining process 1101 or a polish from the polishing process 1103. In an embodiment, the degreasing process 1105 may be a process for removing the oxide layer formed as air contacts the surface of the metal member 410, along with the foreign substances present on the surface of the metal member 410. In an embodiment, the degreasing process 1105 may be a process using a container solvent method using benzene and ethylene, a surfactant method using a neutral detergent and synthetic detergent, or an acid degreasing method using sulfuric acid and nitric acid.

In an embodiment, after the degreasing process 1105 is performed, a surface forming process 1107 may be performed.

As the surface forming process 1107 is at least partially identical or similar to the surface forming process described above in connection with FIG. 5, no detailed description thereof is given.

In an embodiment, a desmutting process 1109 may be a process for removing smut remaining on the surface of the metal member 410 after the surface forming process 1107 is performed. In an embodiment, the desmutting process 1109 may be a process for removing smut on the surface of the metal member 410 using an oxidizing acid, such as nitric acid, hydrofluoric acid, and potassium permanganate. In an embodiment, when the smut remains on the surface of the metal member 410 without being removed, an oxide layer 420 may not be normally formed in an anodizing process 1111.

In an embodiment, the anodizing process 1111 (also referred to as an 'oxide layer forming process') may be a process for forming an oxide layer 420 on at least one surface of the metal member 410. In an embodiment, in the anodizing process, a voltage of about 5 V to about 30 V may be used, and it may be carried out in a temperature range from about 5° C. to about 30° C. in a time range from about 10 minutes to about 3 hours.

In an embodiment, after the anodizing process 1111 is performed, a coloring process may be performed. The coloring process may be a process for implementing a color on the oxide layer 420 formed on at least one surface of the metal member 410 through the anodizing process 1111. The coloring process may be an immersion method for implementing a color with a dye dissolved in a liquid and dispersed and adsorbed by immersing the plate 400 in the solution or an electrolytic coloring method that creates a color in a metal salt electrolyte by applying current to the plate 400.

In an embodiment, in a sealing process and elution process 1113, the sealing process may be a process using a processing method of performing sealing using a metal salt, a non-metal salt processing method of performing sealing with an organic material, and/or a hydration sealing using water and steam. The elution process may include an elution process for removing metal salt. Alternatively, a hot water washing process for washing out foreign substances may be performed instead of the elution process.

In an embodiment, the above-described processes may implement a plate 400 having partially shinny texture and including a metal member 410 with a surface having irregular curves formed thereon and an oxide layer 420.

In an embodiment, after the sealing process and elution process 1113, a process for forming a coating layer may further be formed. For example, a process for forming a coating layer by coating one surface of the oxide layer 420 may further be performed.

In an embodiment, the front plate 202 and/or the rear plate 211 implemented using the plate 400 may be implemented so that the surface pattern of the outer frame (e.g., the frame exposed to the outside) of the front plate 202 and/or the rear plate 211 is identical to the surface pattern of the inner frame (e.g., the frame not exposed to the outside).

According to various embodiments of the present disclosure, a method for manufacturing a plate 400 may comprise a surface forming process for forming a metal member 410 including a first metal, the metal member including a first portion and a second portion, the first portion including irregularities formed by at least one second metal included in a first solution, the at least one second metal being substituted for the a portion of the first metal, the at least one second metal being removed from the metal member by the first solution, a flat second portion being etched by the first solution and an anodizing process for forming an oxide layer 420 formed on at least one surface of the metal member 410.

According to various embodiments, a thickness of the first portion may be smaller than a thickness of the flat second portion.

According to various embodiments, a gloss level of the first portion may be lower than a gloss level of the flat second portion.

According to various embodiments, the plate 400 may have a gloss level range from 15 gloss unit (GU) to 45 GU depending on a position in the plate 400.

According to various embodiments, a roughness of the first portion may be larger than a roughness of the flat second portion.

According to various embodiments, the irregularities included in the first portion may be irregularly distributed on a surface of the metal member 410.

According to various embodiments, 15 to 65 irregularities may be included in a unit area of the metal member 410. A diameter of the irregularities may be in a range from 30 μm to 215 μm.

According to various embodiments, the method may further comprise a machining process, a polishing process, and a degreasing process performed before performing the surface forming process, and a sealing process and an elution process performed after performing the anodizing process.

According to various embodiments, the method may further comprise forming a coating layer disposed on the oxide layer 420.

Further, the structure of the data used in embodiments of the disclosure may be recorded in a computer-readable recording medium via various means. The computer-readable recording medium includes a storage medium, such as a magnetic storage medium (e.g., a ROM, a floppy disc, or a hard disc) or an optical reading medium (e.g., a CD-ROM or a DVD).

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
   a housing including a front plate facing in a first direction and a rear plate facing in a second direction opposite to the first direction; and
   a display disposed in the housing and including a screen area exposed through the front plate,
   wherein at least one of the front plate or the rear plate includes a plate exposed to an outside,
   wherein the plate comprises:
      a metal member including a first metal; and
      an oxide layer formed on at least one surface of the metal member, and
   wherein the at least one surface of the metal member comprises:
      a first portion including irregularities formed by at least one second metal included in a first solution, the at least one second metal being substituted for a portion of the metal member, the at least one second metal being removed from the metal member by the first solution, the irregularities being formed at positions, of the metal member, where the at least one second metal is removed, wherein the irregularities included in the first portion are irregularly distributed in the at least one surface of the metal member; and
      a flat second portion etched by the first solution, and
      wherein a height of the first portion is less than a height of the flat second portion.

2. The electronic device of claim 1, wherein a thickness of the first portion is smaller than a thickness of the flat second portion, and
   wherein the oxide layer formed on the at least one surface of the metal member is formed on the first portion and the flat second portion such that the oxide layer formed on a surface of the irregularities extends from the height of the first portion toward the outside beyond the height of the flat second portion.

3. The electronic device of claim 1, wherein a gloss level of the first portion is lower than a gloss level of the flat second portion.

4. The electronic device of claim 1, wherein the plate has a gloss level range from 15 gloss unit (GU) to 45 GU depending on a position in the plate.

5. The electronic device of claim 1, wherein a roughness of the first portion is larger than a roughness of the flat second portion.

6. The electronic device of claim 1, wherein:
   15 to 65 irregularities are included in a unit area of the metal member, and
   a diameter of the irregularities is in a range from 30 μm to 215 μm.

7. The electronic device of claim 1, wherein the first solution, together with the at least one second metal, includes:
   at least one of nitric acid, sulfuric acid, oxalic acid, phosphoric acid, or chromic acid having a concentration in a range from 50% to 100%, or
   at least one of sodium hydroxide, potassium hydroxide, sodium carbonate, or sodium phosphate having a concentration in a range from 5% to 80%.

8. The electronic device of claim 1, wherein:
   the first metal is aluminum and an aluminum alloy,
   the at least one second metal is at least one metal having an ionization tendency lower than an ionization tendency of the aluminum, and
   a concentration of the at least one second metal included in the first solution is in a range from 0.1% to 10%.

9. The electronic device of claim 1, further comprising a coating layer disposed on the oxide layer.

10. A plate comprising:
    a metal member including a first metal; and
    an oxide layer formed on at least one surface of the metal member,
    wherein the at least one surface of the metal member comprises:
       a first portion including irregularities formed by at least one second metal included in a first solution, the at least one second metal being substituted for a portion of the metal member, the at least one second metal being removed from the metal member by the first solution, the irregularities being formed at positions, of the metal member, where the at least one second metal is removed, wherein the irregularities included in the first portion are irregularly distributed in the at least one surface of the metal member; and
       a flat second portion is etched by the first solution, and
       wherein a height of the first portion is less than a height of the flat second portion.

11. A method for manufacturing a plate, the method comprising:
    a surface forming process for forming a metal member including a first metal, the metal member including a first portion and a flat second portion, the first portion including irregularities formed by at least one second metal included in a first solution, the at least one second metal being substituted for a portion of the metal member metal, the at least one second metal being removed from the metal member by the first solution, the irregularities being formed at positions, of the metal member, where the at least one second metal is removed, the flat second portion being etched by the first solution, wherein a height of the first portion is less than a height of the flat second portion, and the irregularities included in the first portion are irregularly distributed in at least one surface of the metal member; and
    an anodizing process for forming an oxide layer formed on the at least one surface of the metal member.

12. The method of claim 11, wherein the anodizing processing comprises forming the oxide layer on the first portion and the flat second portion such that the oxide layer formed on a surface of the irregularities extends from the height of the first portion toward the outside beyond the height of the flat second portion.

13. The method of claim 11, wherein a gloss level of the first portion is lower than a gloss level of the flat second portion.

14. The method of claim 11, wherein the plate has a gloss level range from 15 gloss unit (GU) to 45 GU depending on a position in the plate.

15. The method of claim 11, wherein a roughness of the first portion is larger than a roughness of the flat second portion.

16. The method of claim 11, wherein:
   15 to 65 irregularities are included in a unit area of the metal member, and
   a diameter of the irregularities is in a range from 30 μm to 215 μm.

17. The method of claim 11, further comprising:
   a machining process, a polishing process, and a degreasing process performed before performing the surface forming process; and
   a sealing process and an elution process performed after performing the anodizing process.

18. The method of claim 11, further comprising forming a coating layer disposed on the oxide layer.

* * * * *